US012593669B2

(12) United States Patent
Lin

(10) Patent No.:    US 12,593,669 B2
(45) Date of Patent:        Mar. 31, 2026

(54) METHOD OF MANUFACTURING SEMICONDUCTOR STRUCTURE

(71) Applicant: NANYA TECHNOLOGY CORPORATION, New Taipei City (TW)

(72) Inventor: Li Han Lin, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 419 days.

(21) Appl. No.: 18/377,772

(22) Filed: Oct. 7, 2023

(65) Prior Publication Data

US 2025/0118597 A1        Apr. 10, 2025

(51) Int. Cl.
*H01L 21/768*        (2006.01)
(52) U.S. Cl.
CPC .. *H01L 21/76832* (2013.01); *H01L 21/76834* (2013.01)

(58) Field of Classification Search
CPC ................... H01L 21/76832; H01L 21/76834
See application file for complete search history.

(56) References Cited

U.S. PATENT DOCUMENTS

2007/0197021 A1    8/2007  Nam et al.
2016/0322364 A1    11/2016  Han et al.

*Primary Examiner* — Jay C Kim
*Assistant Examiner* — Woo K Lee
(74) *Attorney, Agent, or Firm* — CKC & Partners Co., LLC

(57)        ABSTRACT

A method of manufacturing a semiconductor structure includes the following steps. A bit line structure is formed over a substrate. A first spacer layer is formed on a first sidewall of the bit line structure. A second spacer layer is formed on a second sidewall of the first spacer layer. A third spacer layer is formed on a third sidewall of the second spacer layer. An oxidation process is performed on the second spacer layer, thereby forming an oxidized portion and a remaining portion in the second spacer layer, in which the oxidized portion is between the remaining portion and the third spacer layer. A fourth spacer layer is formed on a fourth sidewall of the third spacer layer.

17 Claims, 13 Drawing Sheets

100

WL

ACT

A     A

DC     LP     BC     BL 110  311  212  214  216

216   214   212 311   110

110P 410      410

110      420      110      110

110P 410        410

Z

Y   X

100

METHOD OF MANUFACTURING SEMICONDUCTOR STRUCTURE

BACKGROUND

Field of Invention

The present disclosure relates to a method of manufacturing a semiconductor structure.

Description of Related Art

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. However, such dielectric materials encounter a lot of processing problems that prevent further improvement of the dielectric constant.

In the process of manufacturing semiconductor devices, there is a need to deposit low-K spacers (LKS) on different substrate surfaces with good uniformity. These different surfaces can constitute different materials, for example a metal and a dielectric. Uniform deposition of one material on two or more different substrate surfaces while maintaining the distance between metal features is a problem that needs to be solved.

SUMMARY

One aspect of the disclosure provides a method of manufacturing a semiconductor structure. The method of manufacturing the semiconductor structure includes the following steps. A bit line structure is formed over a substrate. A first spacer layer is formed on a first sidewall of the bit line structure. A second spacer layer is formed on a second sidewall of the first spacer layer. A third spacer layer is formed on a third sidewall of the second spacer layer. An oxidation process is performed on the second spacer layer, thereby forming an oxidized portion and a remaining portion in the second spacer layer, in which the oxidized portion is between the remaining portion and the third spacer layer. A fourth spacer layer is formed on a fourth sidewall of the third spacer layer.

According to one or more embodiments of the present disclosure, the first spacer layer includes an insulating nitride.

According to one or more embodiments of the present disclosure, the second spacer layer includes SiCO.

According to one or more embodiments of the present disclosure, the third spacer layer includes an insulating oxide.

According to one or more embodiments of the present disclosure, the fourth spacer includes an insulating nitride.

According to one or more embodiments of the present disclosure, performing the oxidation process on the second spacer layer is prior to forming the fourth spacer layer on the fourth sidewall of the third spacer layer.

According to one or more embodiments of the present disclosure, the oxidized portion of the second spacer layer includes $SiO_2$ and the third spacer layer includes $SiO_2$.

According to one or more embodiments of the present disclosure, the oxidation process is a plasma oxidation process.

According to one or more embodiments of the present disclosure, the plasma oxidation process includes $O_2$ and $H_2N_2$ plasma oxidation process.

According to one or more embodiments of the present disclosure, the first spacer layer, the second spacer layer, and the third spacer layer have a first thickness, a second thickness, and a third thickness, respectively, the second thickness is greater than the third thickness, and the third thickness is greater than the first thickness.

Another aspect of the disclosure provides a method of manufacturing a semiconductor structure. The method of manufacturing the semiconductor structure includes the following steps. A bit line structure is formed over a substrate. A first spacer layer is formed on a first sidewall of the bit line structure, in which the first spacer layer includes an insulating nitride. A second spacer layer is formed on a second sidewall of the first spacer layer, in which the second spacer layer includes SiCO and has a first portion and a second portion, and the first portion is between the first spacer layer and the second portion. A third spacer layer is formed to cover the second portion of the second spacer layer. An oxidation process is performed to oxidize the second portion of the second spacer layer. A fourth spacer layer is formed on a third sidewall of the third spacer layer. A buried contact is formed adjacent to the fourth spacer layer.

According to one or more embodiments of the present disclosure, the oxidation process is a plasma oxidation process.

According to one or more embodiments of the present disclosure, the plasma oxidation process includes $O_2$ and $H_2N_2$ plasma oxidation process.

According to one or more embodiments of the present disclosure, the third spacer layer has a first thickness before performing the oxidation process, the third spacer layer has a second thickness after performing the oxidation process, and the second thickness is less than the first thickness.

According to one or more embodiments of the present disclosure, the third spacer layer includes an insulating oxide.

According to one or more embodiments of the present disclosure, the fourth spacer layer includes an insulating nitride.

According to one or more embodiments of the present disclosure, performing the oxidation process to oxidize the second portion of the second spacer layer is prior to forming the fourth spacer layer on the third sidewall of the third spacer layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
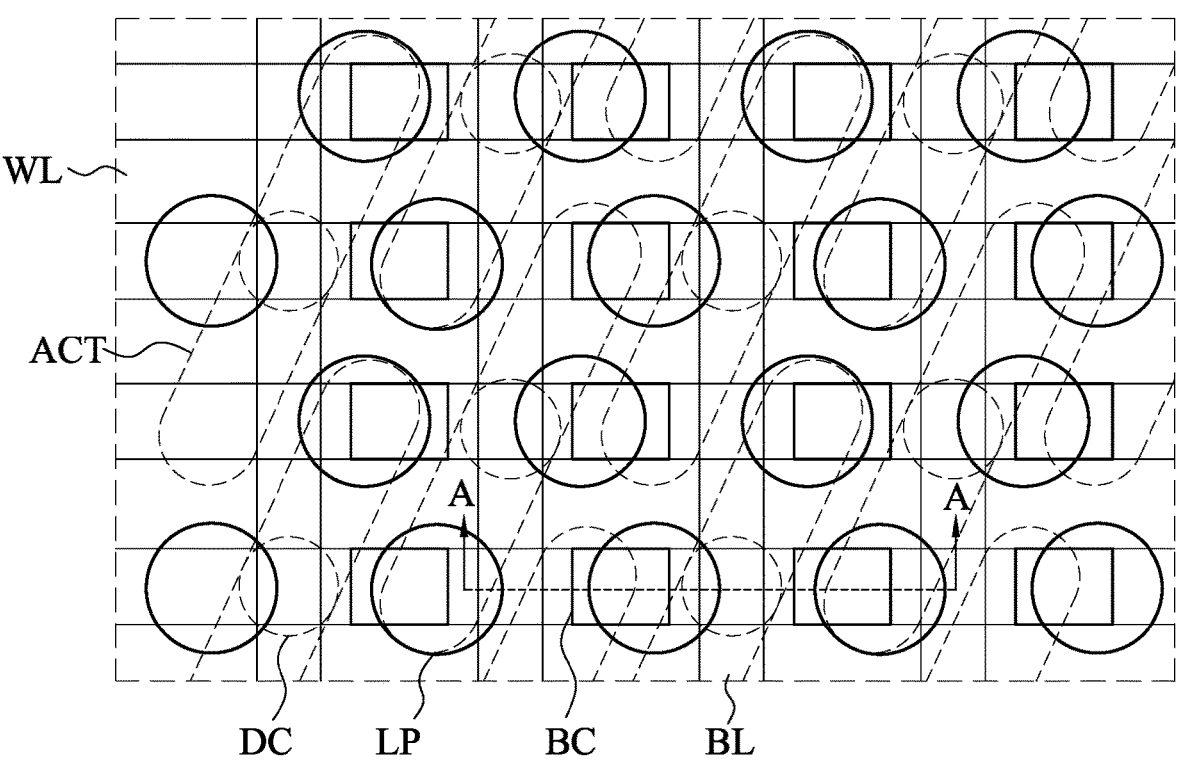
FIG. 1 is an arrangement diagram of a semiconductor structure according to some embodiments of the present disclosure.
Figure 1:
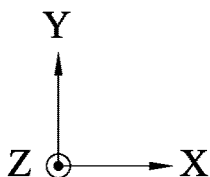

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an arrangement diagram of a semiconductor structure 100 according to some embodiments of the present disclosure. The semiconductor structure 100 may include a plurality of active areas ACT. The active area ACT has a short axis and a long axis. In some embodiment, the long axis of the active area ACT may extend in a diagonal axis with respect to an X axis.

A plurality of word lines WL may be configured across the active areas ACT and extend along the X axis. The word line WL is in parallel to each other. Additionally, the word line WL may be spaced apart from each other at substantially equal intervals.

A plurality of bit lines BL may be arranged above the word lines WL and may extend along a Y axis. Similarly, the lines BL is in parallel to each other. In addition, the bit line BL can be connected to the active area ACT through a direct contact DC. One active area ACT may be electrically connected to one direct contact DC.

A plurality of buried contacts BC may be formed between two adjacent bit lines BL. In some embodiments, the buried contacts BC may be spaced apart from each other along the Y axis. The buried contact BC may electrically connect a lower electrode of the capacitor (not shown) to a corresponding active area ACT. One active area ACT may be electrically connected to two buried contacts BC.

A plurality of landing pads LP may be disposed above the buried contacts BC and overlap at least a portion of a corresponding bit line BL. The landing pad may electrically connect the buried contact BC. Also, the landing pad LP may also electrically connect the lower electrode of the capacitor (not shown) to a corresponding active area ACT. In another words, the lower electrode of the capacitor (not shown) may be electrically connected to a corresponding active area ACT through a corresponding buried contact BC and a corresponding landing pad LP.

In some embodiments, one buried contact BC and one landing pad LP may collectively be referred to as a contact plug, and may be respectively referred to as a first contact plug (BC) and a second contact plug (LP).

FIG. 2 and FIGS. 5-12 are cross-sectional views illustrating different steps of a method of manufacturing a semiconductor structure (e.g., semiconductor structure 100) in accordance with some embodiments of the present disclosure. The enlarged views of FIG. 5 to FIG. 9 are based on a reference cross-sectional view taken along block B shown in FIG. 2.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Figure 2:
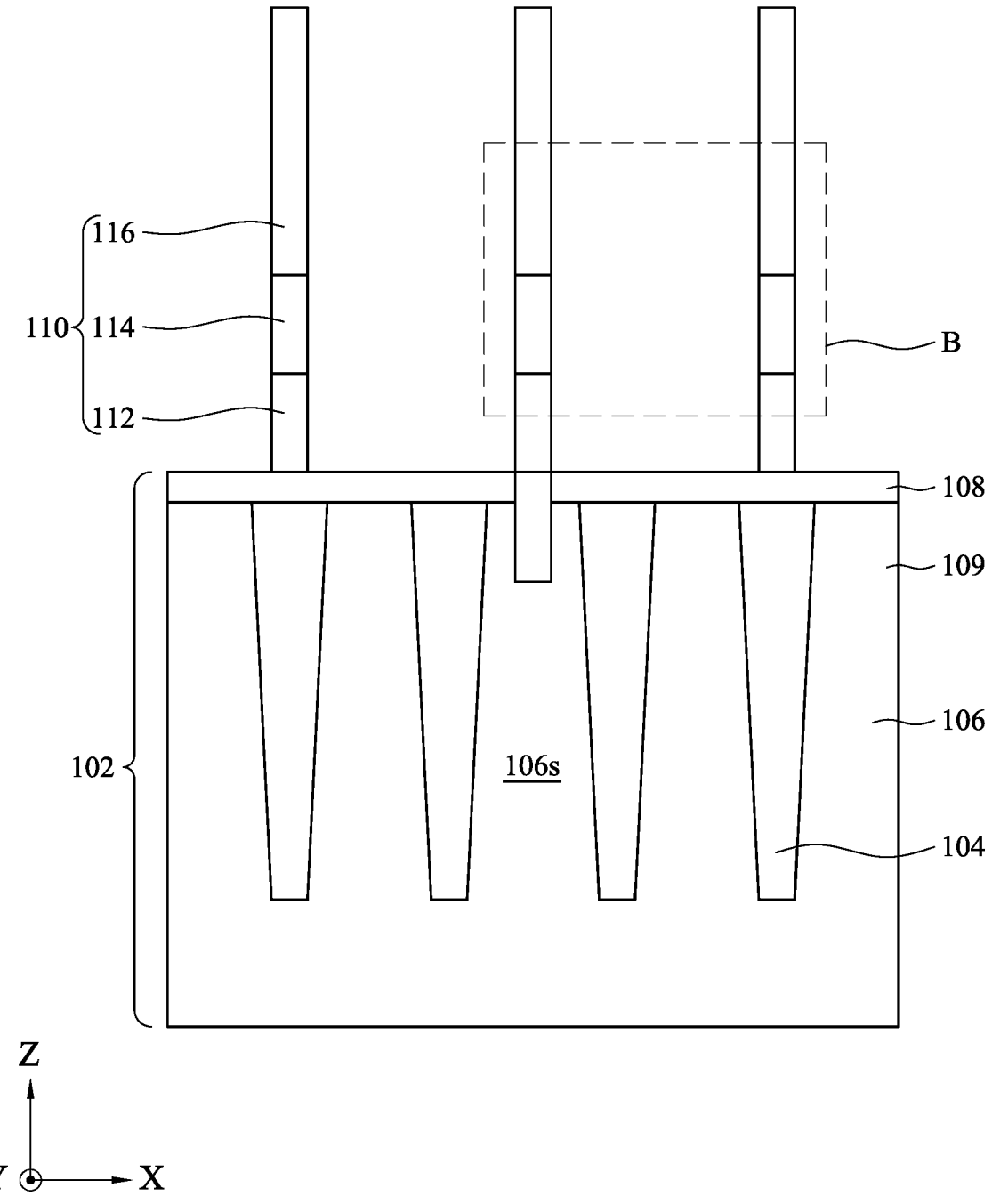
FIG. 2 is a cross-sectional view of a semiconductor structure at various fabrication stages constructed according to various embodiments of the present disclosure.

Referring to FIG. 2, a plurality of bit line structures 110 are formed over a substrate 102.

The substrate 102 includes a plurality of isolation areas 104 and a plurality of active areas 106. The active areas 106 are spaced apart by the isolation areas 104. The substrate 102 may include, for example, silicon (e.g., crystalline silicon, polycrystalline silicon, or amorphous silicon). In some embodiments, the substrate 102 may include other elementary semiconductor such as germanium. In some embodiments, the substrate 102 may include an alloy semiconductor such as silicon germanium, gallium indium phosphide, silicon germanium carbide and the like. In some embodiments, the substrate 102 may include compound semiconductor such as silicon carbide, gallium arsenic, indium phosphide, indium arsenide and the like. Further, the substrate 102 may optionally include a semiconductor-on-insulator (SOI) structure.

The isolation areas 104 may be formed through a shallow trench isolation (STI) process. The isolation areas 104 may include, for example, a material including at least one of silicon oxide, silicon nitride, and silicon oxynitride. The isolation areas 104 may be a single layer including one kind of insulator, a double layer including two kinds of insulators, or a multilayer including a combination of at least three kinds of insulators. For example, the isolation areas 104 may include silicon nitride and silicon oxide. For example, the isolation areas 104 may include a triple layer including silicon oxide, silicon nitride, and silicon oxynitride.

In some embodiments, an insulation layer 108 is formed on the substrate 102 and covers a top surface of the isolation areas 104 and the active areas 106 of the substrate 102. In some embodiments, an opening (not shown) may expose at least one active area among the active areas 106 of the substrate 102 during a process of forming the insulation layer 108. The opening is then filled with a conductive material to form a direct contact 109. At least one active area which contacts the direct contact 109 may be referred to as a source area 106S. The direct contact 109 may be electrically connected to the source area 106S.

A plurality of bit line structures 110 protrudes from the substrate 102. In some embodiments, the bit line structures 110 may be regularly arranged at substantially equal intervals from each other over the substrate 102. The bit line structure 110 may further include three portions along a vertical direction substantially perpendicular to the substrate 102 (e.g., along Z direction). For example, each bit line structure 110 may include a metal nitride layer 112, a metal layer 114, and a hard mask layer 116 sequentially stacked on the substrate. The metal nitride layer 112 may be, for example, a titanium nitride layer. The metal layer 114 may be, for example, a tungsten layer. The hard mask layer 116 may be, for example, a silicon nitride layer.

In some embodiments, prior to the formation of the metal nitride layer 112, the substrate 102 may be subjected to a pre-metal cleaning operation. Further, in some embodiments, the substrate 102 may be subjected to a post-metal cleaning operation after the formation of the metal nitride layer 112. Other cleaning operations or sub-operations can be optionally applied, and are not limited herein. The plurality of bit line structures 110 can be the same or different. Details of arrangement of stacked materials of the bit line structures 110 are not limited herein and can be adjusted according to different applications.

Figure 3:
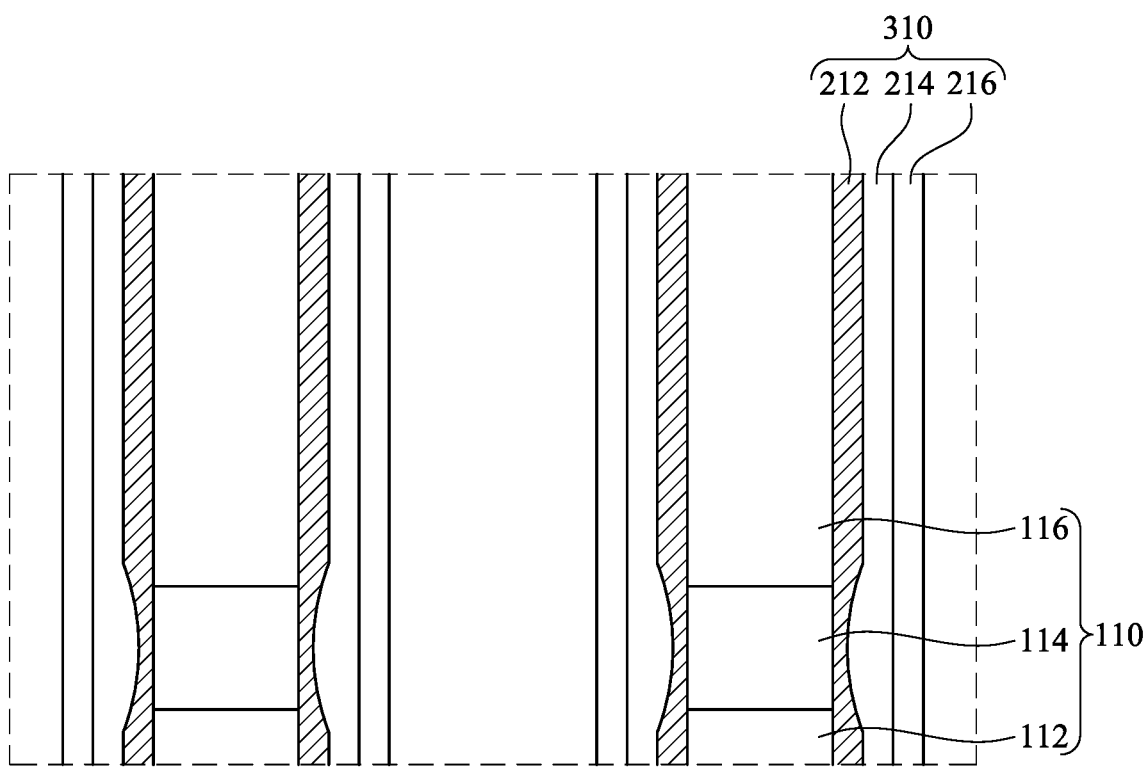
FIG. 3 is an enlarged view of a semiconductor structure at a certain fabrication stage constructed according to a comparative example.

FIG. 3 is an enlarged view taken along block B shown in FIG. 2 according to a comparative example. As shown in FIG. 3, a spacer structure 210 is formed on the bit line structure 110. Particularly, the spacer structure 210 extends along a sidewall of the bit line structure 110. The spacer structure 210 may include a first spacer layer 212, a second spacer layer 214 and a third spacer layer 216 successively formed over the bit line structure 110. That is, the second spacer layer 214 is sandwiched between the first spacer layer 212 and the third spacer layer 216. In some embodiments, the second spacer layer 214 includes oxide. For example, the second spacer layer 214 may include silicon oxide. In some embodiments, the third spacer layer 216 includes silicon nitride. In some embodiments, the first spacer layer 212 includes SiCO with a dielectric constant (k) of approximate 4.3 for reducing parasitic capacitance between the bit line structures 110.

It may be clearly seen from FIG. 3 that the first spacer layer 212, which is adjacent the metal layer 114 of the bit line structure 110, is formed with a non-uniform thickness that is decreased from the first spacer layer 212 toward the metal layer 114. This situation is observed when the material of the first spacer layer 212 does not adhere well to the material of the metal layer 114. For example, when the first spacer layer 212 is made of SiCO which does not adhere well to tungsten of the metal layer 114, the first spacer layer 212 is formed with a concave profile shape. As such, it is easy to cause current leakage problem in a semiconductor device.

Figure 4:
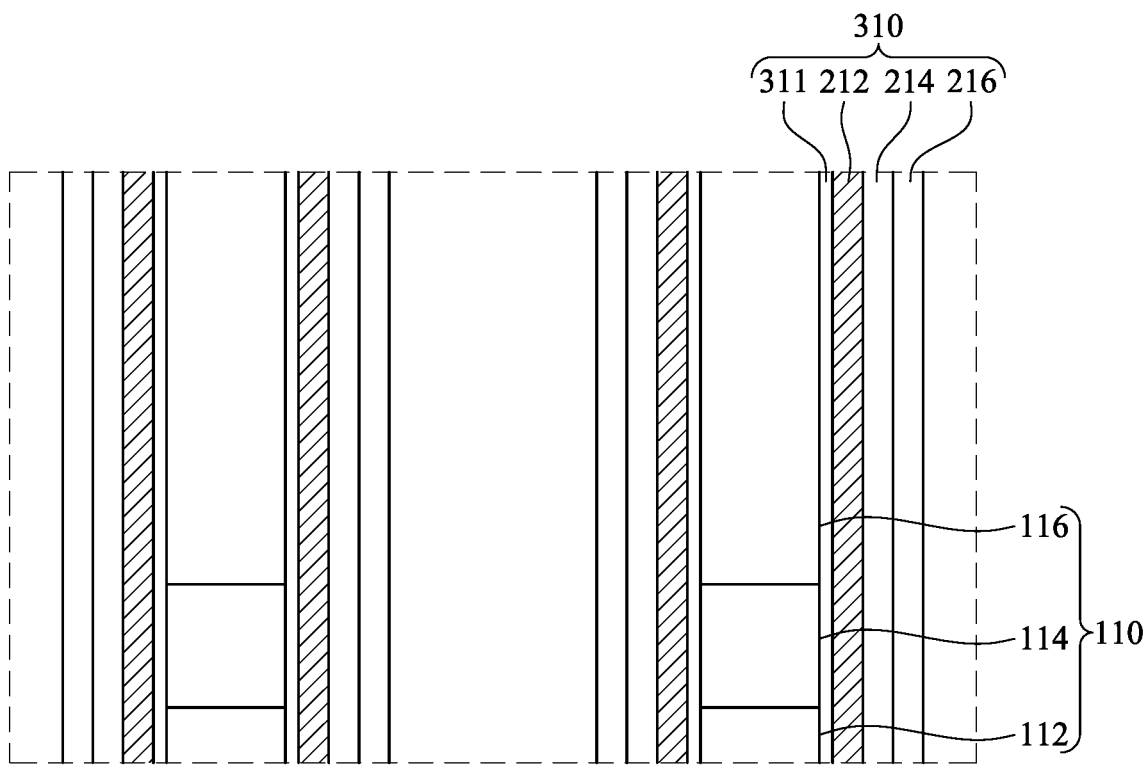
FIG. 4 is an enlarged view of a semiconductor structure at various fabrication stage constructed according to various embodiments of the present disclosure.

FIG. 4 is an enlarged view taken along block B shown in FIG. 2 according to various embodiments of the present disclosure. In order to solve the above current leakage problem, the present disclosure forms an additional layer of nitride spacer between the SiCO layer and the bit line structure. More specifically, a spacer structure 310 is formed on the bit line structure 110 as shown in FIG. 4. The spacer structure 310 extends along a sidewall of the bit line structure 110. The spacer structure 310 may include a first spacer layer 311, a second spacer layer 212, a third spacer layer 214, and a fourth spacer layer 216 successively formed over the bit line structure 110. That is, the second spacer layer 214 and the third spacer layer 214 is sandwiched between the first spacer layer 212 and the fourth spacer layer 216. In some embodiments, the first spacer layer 311 may include an insulating nitride. For example, the first spacer layer 311 includes silicon nitride. In some embodiments, the second spacer layer 212 includes SiCO. In some embodiments, the third spacer layer 214 may include insulating oxide. For example, the third spacer layer 214 includes silicon oxide ($SiO_2$). In some embodiments, the fourth spacer layer 216 may include insulating nitride. For example, the fourth spacer layer 216 may include silicon nitride. The detailed manufacturing process of the spacer structure 310 would be described below.

Figure 5:
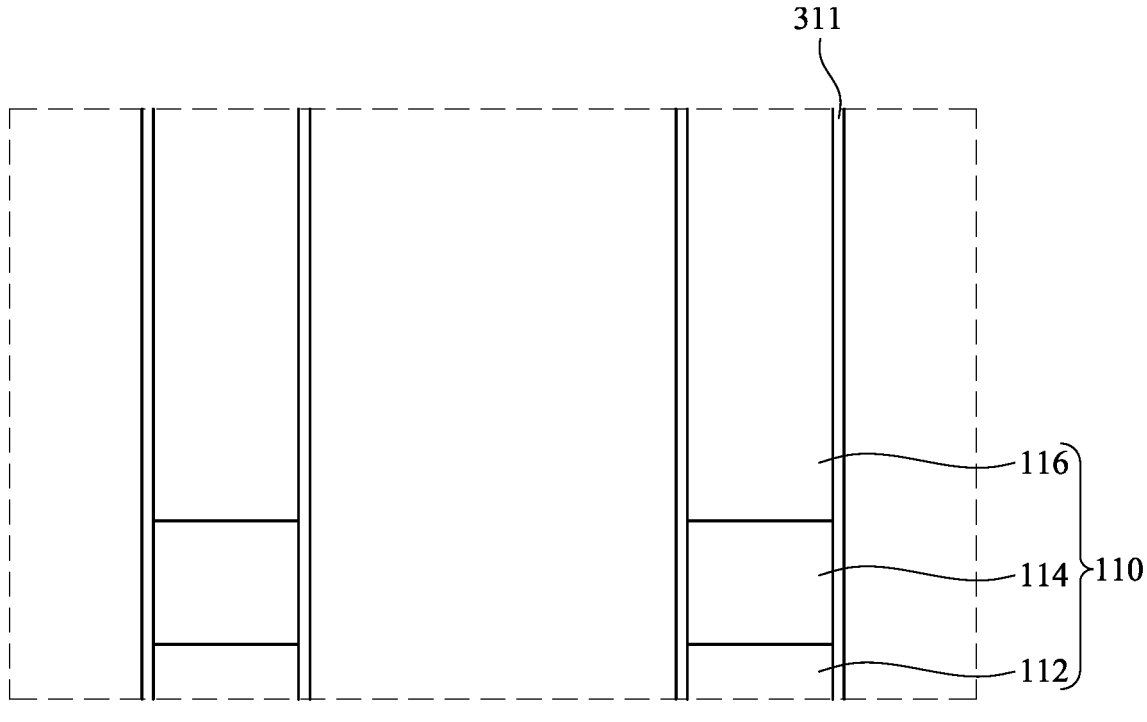
FIG. 5 is an enlarged view of a semiconductor structure at various fabrication stages constructed according to various embodiments of the present disclosure.

FIGS. 5-9 are enlarged views of the spacer structure 310 at various fabrication stages constructed according to various embodiments of the present disclosure. Referring to FIG. 5, the first spacer layer 311 is formed on a sidewall of the bit line structure 110. In some embodiments, the first spacer layer 311 may be formed by any suitable deposition approaches such as chemical vapor deposition (CVD) techniques, atomic layer deposition (ALD), or physical vapor deposition (PVD) techniques. In some embodiments, a thickness of the first spacer layer 311 is ranged from about 2 nm to about 20 nm, such as 4 nm, 6 nm, 8 nm, 10 nm, 12 nm, 14 nm, 16 nm, or 18 nm.

Figure 6:
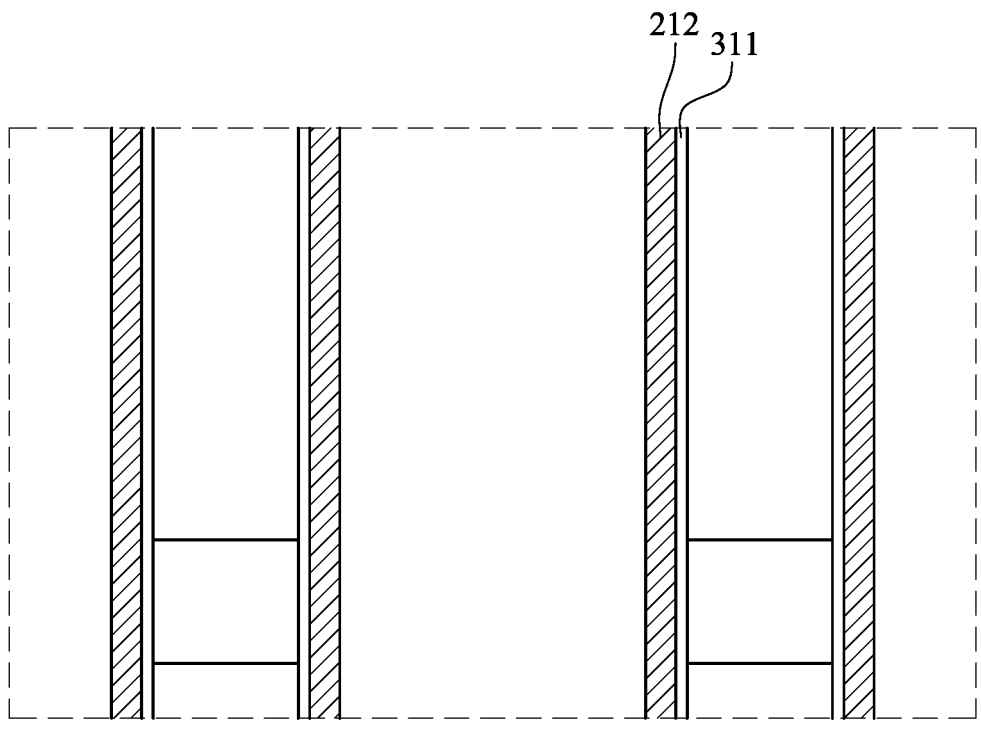
FIG. 6 is an enlarged view of a semiconductor structure at various fabrication stages constructed according to various embodiments of the present disclosure.

Referring to FIG. 6, the second spacer layer 212 is formed on a sidewall of the first spacer layer 311. In some embodiments, the second spacer layer 212 may be formed by any suitable deposition approaches such as chemical vapor deposition (CVD) techniques, atomic layer deposition (ALD), or physical vapor deposition (PVD) techniques.

Figure 7:
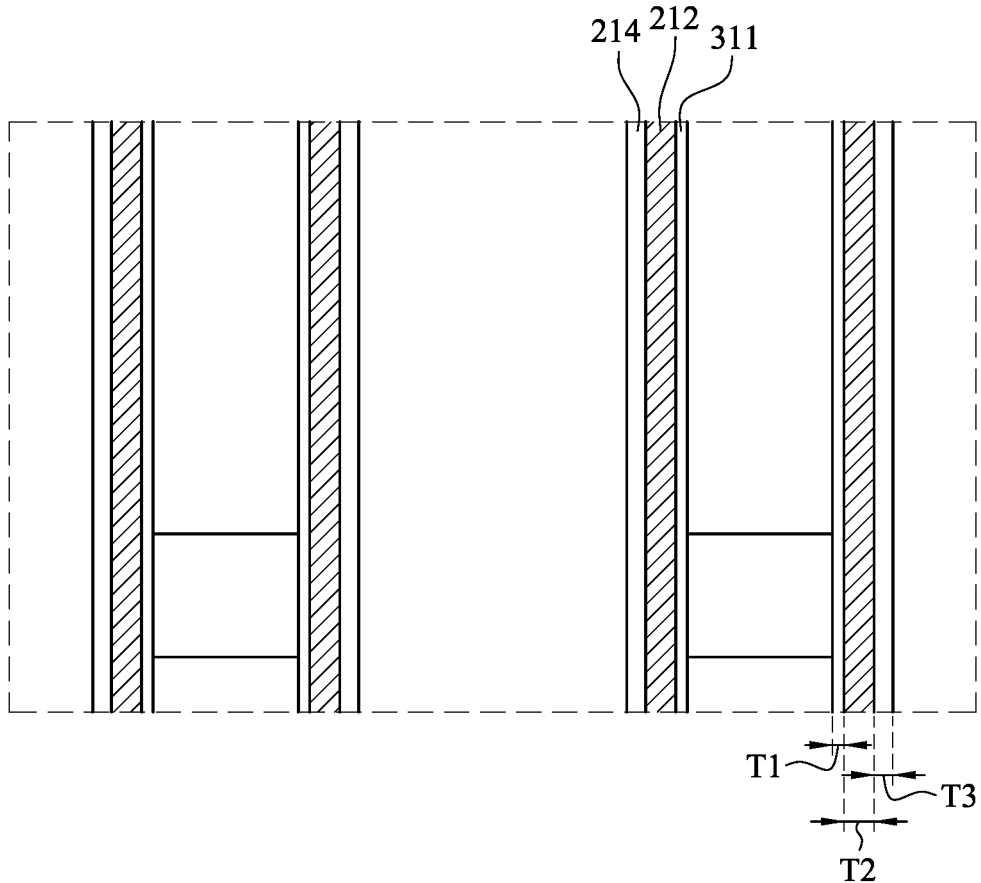
FIG. 7 is an enlarged view of a semiconductor structure at various fabrication stages constructed according to various embodiments of the present disclosure.

Referring to FIG. 7, the third spacer layer 214 is formed on a sidewall of the second spacer layer 212. In some embodiments, the third spacer layer 214 may be formed by any suitable deposition approaches such as chemical vapor deposition (CVD) techniques, atomic layer deposition (ALD), or physical vapor deposition (PVD) techniques.

In some embodiments, the first spacer layer 311 has a first thickness T1, the second spacer layer 212 has a second thickness T2, and the third spacer layer 214 has a third thickness T3. The second thickness T2 is greater than the third thickness T3, and the third thickness T3 is greater than the first thickness T1.

Figure 8:
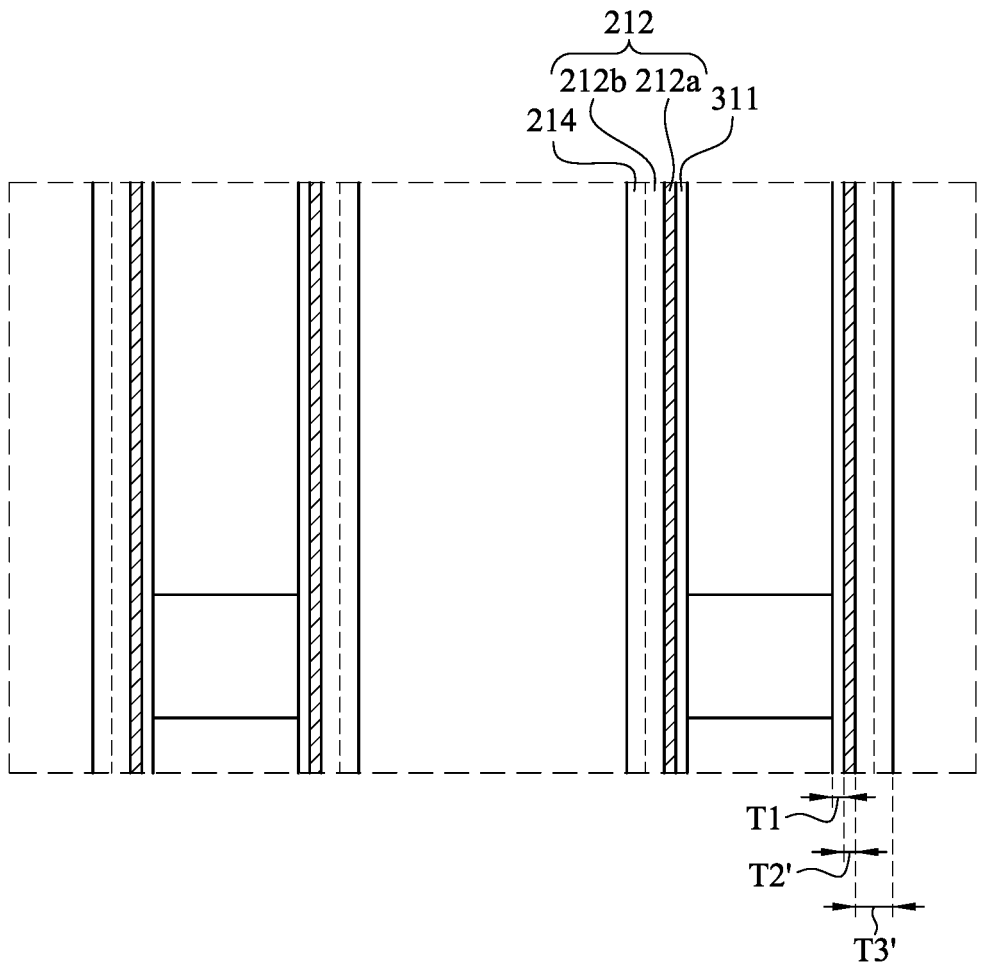
FIG. 8 is an enlarged view of a semiconductor structure at various fabrication stages constructed according to various embodiments of the present disclosure.

Referring to FIG. 8, an oxidation process is performed on the second spacer layer 212, thereby forming an oxidized portion 212b and a remaining portion 212a in the second spacer layer 212, and the oxidized portion 212b is between the remaining portion 212a and the third spacer layer 214. To be specific, the oxidation process is performed on the third spacer layer 214 and the second spacer layer 212 at the same time. More specifically, the second spacer layer 212 has a first portion 212a and a second portion 212b, and the first portion 212a is between the first spacer layer 311 and the second portion 212b. In other words, the second spacer layer 212 has a first portion 212a adjacent to the first spacer layer 311 and a second portion 212b away from the first spacer layer 311. That is to say, the first portion 212a of the second spacer layer 212 is adjacent to the first spacer layer 311 and the second portion 212b of the second spacer layer 212 is adjacent to the third spacer layer 214.

In some embodiments, the oxidation process is a plasma oxidation process. More specifically, the plasma oxidation process includes $O_2$ and $H_2N_2$ plasma oxidation process. It is noted that after performing the plasma oxidation process to the second spacer layer 212, the second portion 212b of the second spacer layer 212 is oxidized into a material different from the original material and a portion of the third spacer 214 would be removed. Therefore, the first portion 212a of the second spacer layer 212 may also be named the remaining portion 212a. In addition, the thickness of the third spacer 214 after performing the plasma oxidation process is less than the thickness of the third spacer 214 before performing the plasma oxidation process. The material of the second portion 212b includes a same material with the third spacer layer 214, after performing the plasma oxidation process. For example, the material of the first portion 212a includes SiCO, and the materials of the second portion 212b and the third spacer both include $SiO_2$ after performing the plasma oxidation process. Therefore, the second portion 212b may be considered as a portion of the third spacer layer 214 after performing the oxidation process. It should be understood that the first portion 212a including SiCO has a thickness T2' which is less than the thickness T2, and the second portion 212b and the third spacer layer 214 including $SiO_2$ have a thickness T3' which is greater than the thickness T3. It should be noted that the thickness T2' of the first portion 212a is related to the plasma oxidation treatment time. In other words, the longer the treatment time for plasma oxidation process, the smaller the thickness T2' of the first portion 212a would be.

Figure 9:
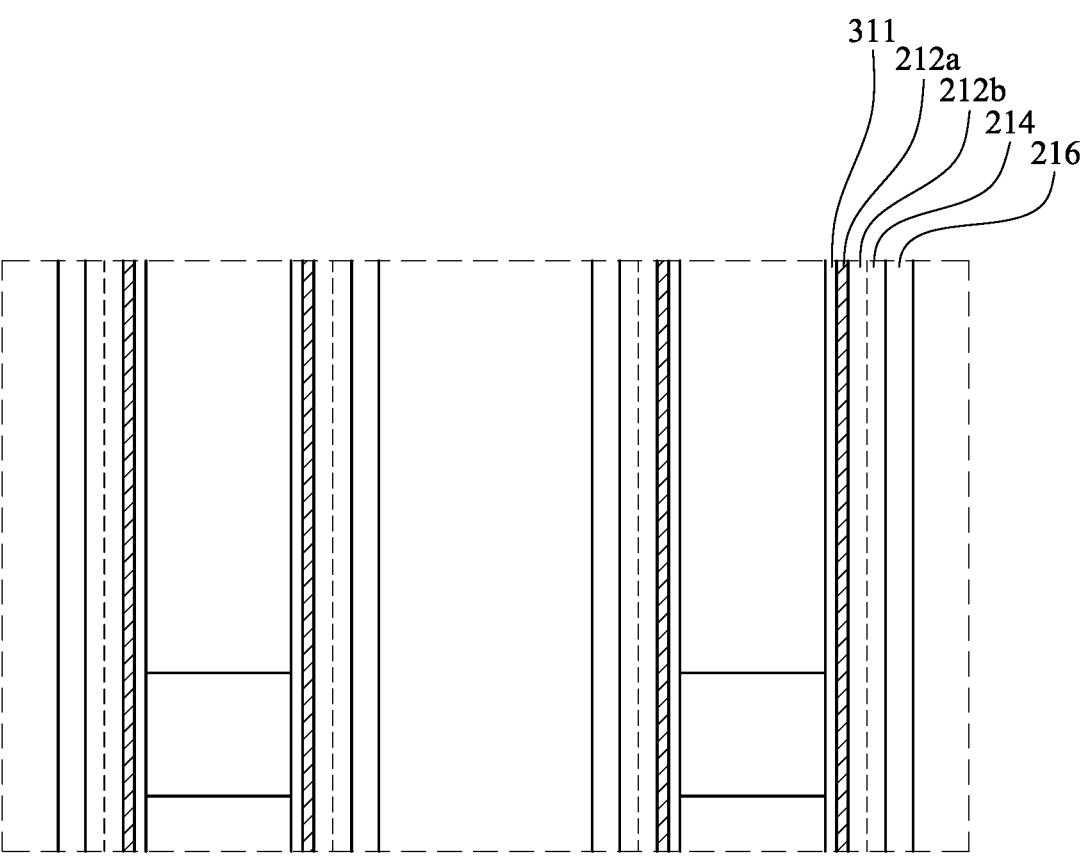
FIG. 9 is an enlarged view of a semiconductor structure at various fabrication stages constructed according to various embodiments of the present disclosure.

Referring to FIG. 9, the fourth spacer layer 216 is formed on a sidewall of the third spacer layer 214. In some embodiments, performing the oxidation process on the second spacer layer 212 is prior to forming the fourth spacer layer 216 on the sidewall of the third spacer layer 214. In some embodiments, the fourth spacer layer 216 may be formed by any suitable deposition approaches such as chemical vapor deposition (CVD) techniques, atomic layer deposition (ALD), or physical vapor deposition (PVD) techniques.

Figure 10:
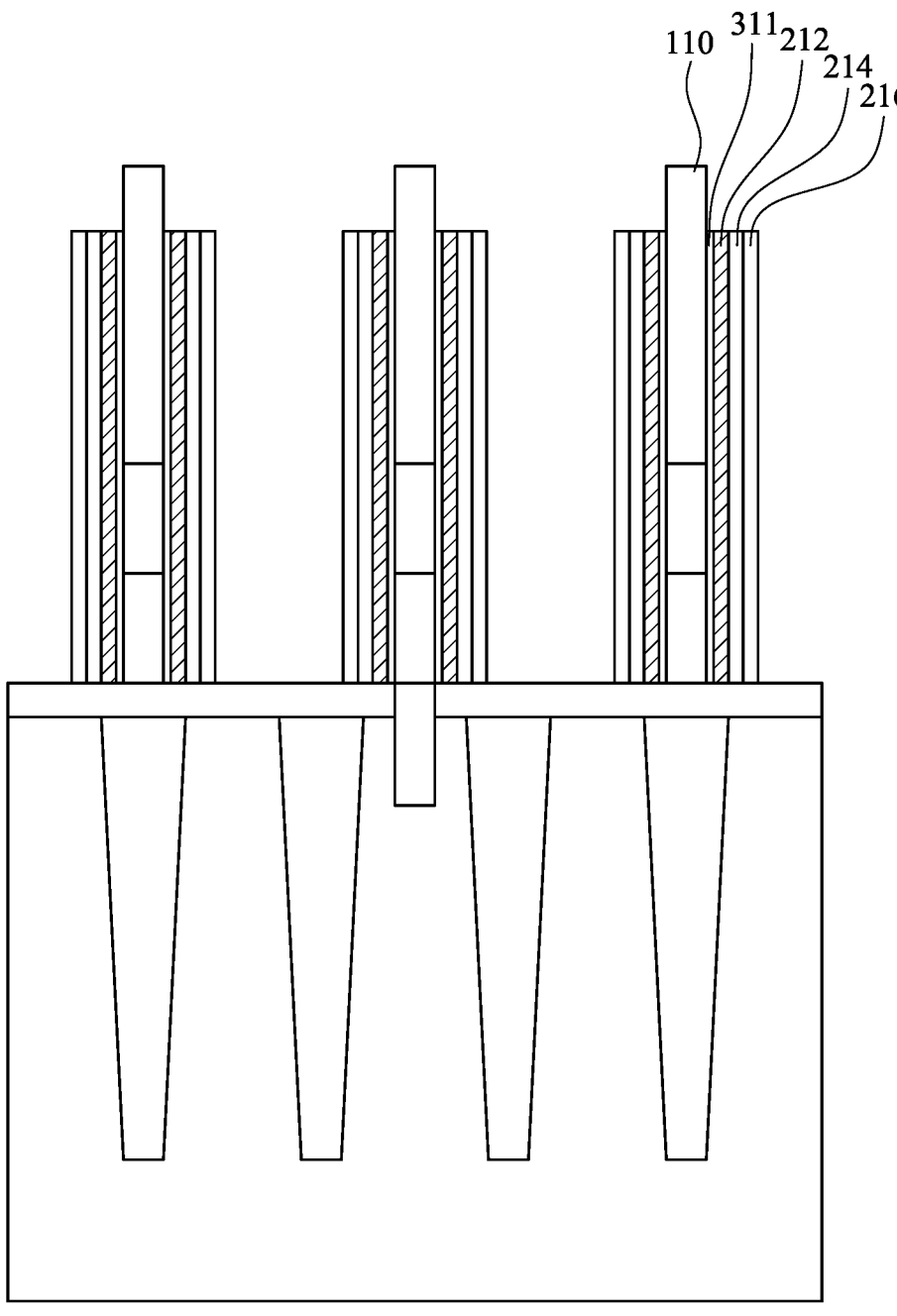
FIG. 10 is a cross-sectional view of a semiconductor structure at various fabrication stages constructed according to various embodiments of the present disclosure.
Figure 10:
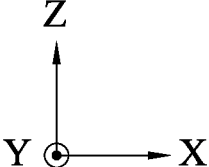

Referring to FIG. 10, any suitable etching approaches such as reactive ion etching (RIE) techniques may be implemented on the first spacer layer 311, the second spacer layer 212, the third spacer layer 214, and/or the fourth spacer layer 216 to form a particular configuration depending on a design of a semiconductor structure, in some embodiments. The first spacer layer 311, the second spacer layer 212, the third spacer layer 214, and the fourth spacer layer 216 may be etched to expose a portion 110p of the bit line structure 110, in some embodiments. Alternatively, the first spacer layer 311, the second spacer layer 212, the third spacer layer 214, and the fourth spacer layer 216 may be etched to expose a top surface of the bit line structure 110, in other embodiment. In another words, top surfaces of the first spacer layer 311, the second spacer layer 212, the third spacer layer 214, and the fourth spacer layer 216 may be leveled with a top surface of the bit line structure 110. In some embodiments, the configuration of the flat surface shown in FIG. 10 is for a purpose of illustration only. In accordance with some other embodiments of the present disclosure, other configurations may be formed with different parameters in the etching process.

Figure 11:
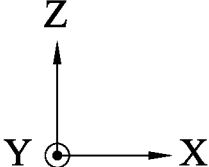
FIG. 11 is a cross-sectional view of a semiconductor structure at various fabrication stages constructed according to various embodiments of the present disclosure.

Referring to FIG. 11, a buried contact 410 is formed adjacent to the fourth spacer layer 216. To be specific, the buried contact 410 is disposed between the adjacent the bit line structure 110 and is in direct contact with the fourth spacer layer 216. The buried contact 410 includes a silicon-containing material. In some embodiments, the buried contact 410 may include doped polysilicon.

Figure 12:
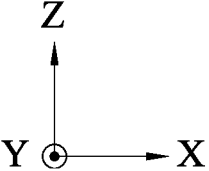
FIG. 12 is a cross-sectional view of a semiconductor structure at various fabrication stages constructed according to various embodiments of the present disclosure.

Referring to FIG. 12, a landing pad material 420 is formed on the bit line structure 110 and between two adjacent bit line structures 110. In some embodiments, a top surface of the landing pad material 420 is higher than a top surface of the bit line structure 110. To be specific, the landing pad material 420 covers the portion 110p of the bit line structure 110 and side surfaces and top surfaces of the first spacer layer 311, the second spacer layer 212, the third spacer layer 214, and the fourth spacer layer 216.

In some embodiments, the landing pad material 420 includes a conductive material. For example, the conductive material is a void-free structure. To achieve the void-free structure, forming the conductive material may include several deposition processes and etching processes. In some embodiments, a deposition/etch-back/deposition (dep/etch/dep) process is employed to deposit the conductive material into a gap (not shown) between two adjacent bit line structures 110. The dep-etch-dep process involves depositing conductive material, followed by etching some of the conductive material back to widen an opening (not shown) of the gap, and followed by re-depositing conductive material.

The landing pad material 420 may be deposited by using CVD, ALD, PVD, or other suitable deposition process. In some embodiments, a deposition temperature used in the deposition process is in a range of about 280° C. to about 320° C. For example, the deposition temperature used in the deposition process can be 280° C., 290° C., 300° C., 310° C., or 320° C. The etching process performed after the deposition process includes using any suitable dry etching processes and/or wet etching processes. The landing pad material 420 may be stacked with materials including metal nitride or metal such as tungsten, tungsten nitride, and/or titanium nitride.

Figure 13:
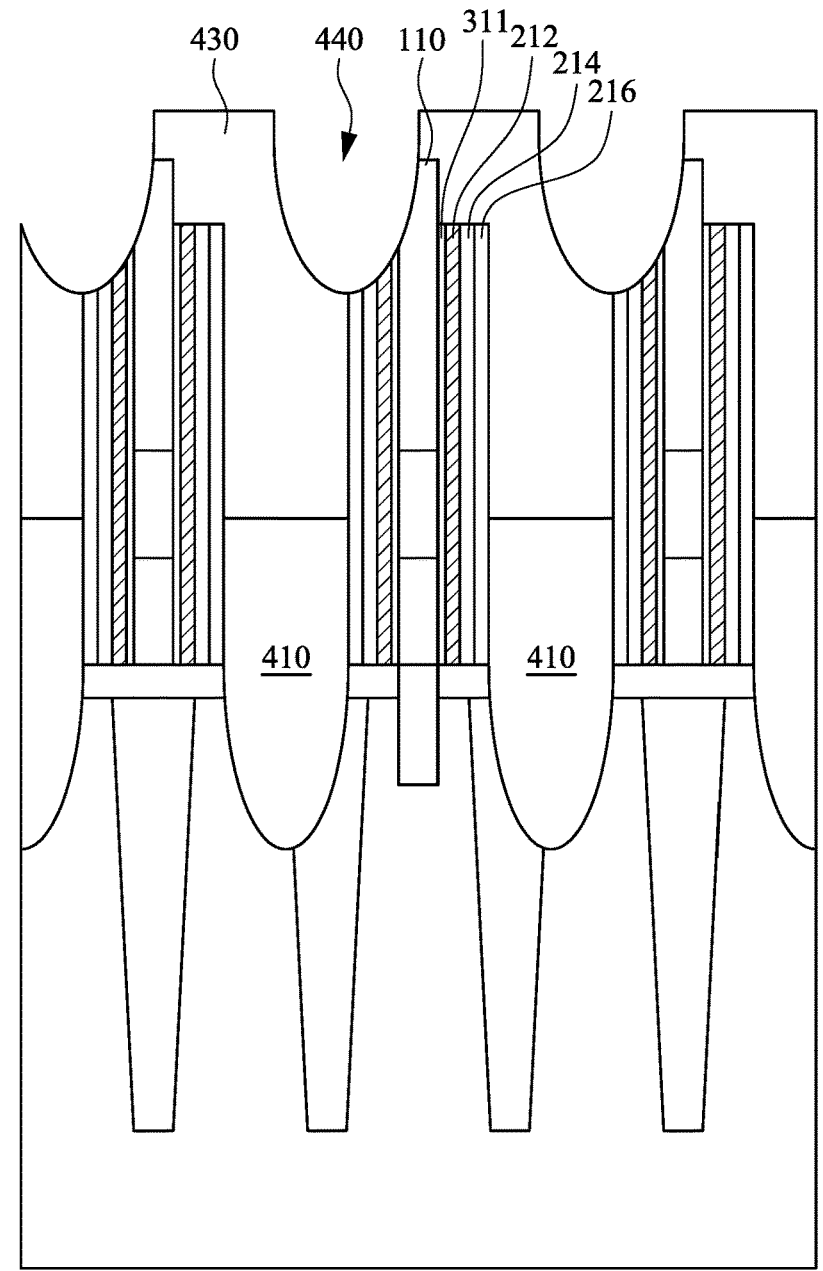
FIG. 13 is a cross-sectional view of a semiconductor structure at various fabrication stages constructed according to various embodiments of the present disclosure.
Figure 13:
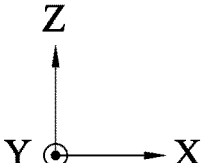

Referring to FIG. 13, at least a portion of the landing pad material 420 is removed to form a landing pad 430. A mask pattern (not shown) may be formed on the landing pad material 420. Subsequently, the landing pad material 420 is etched with the mask pattern as an etch mask. In some embodiments, a portion of the bit line structure 110, the first spacer layer 311, the second spacer layer 212, the third spacer layer 214, and the fourth spacer layer 216 disposed on the sidewalls thereof or a portion of the landing pad material 420 may be removed as well. After etching, the landing pad 430 is formed and may be separated from each other by a hole 440. Furthermore, the landing pad 430 is formed based on the landing pad material 420. Thus, the landing pad 430 may include the void-free structure.

The above embodiments provide various advantages. With the above-mentioned method and configuration thereof, even if the semiconductor structure of the present disclosure includes at least four layers of spacers, the uniformity of thickness of each spacer may be maintained without increasing the overall thickness of the spacer structure, so that the volume of the buried contact subsequently formed in the present disclosure could be maintained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor structure, comprising:
   forming a bit line structure over a substrate;
   forming a first spacer layer on a first sidewall of the bit line structure;
   forming a second spacer layer on a second sidewall of the first spacer layer;
   forming a third spacer layer on a third sidewall of the second spacer layer;
   performing an oxidation process on the second spacer layer, thereby forming an oxidized portion and a remaining portion in the second spacer layer, wherein the oxidized portion is between the remaining portion and the third spacer layer; and
   forming a fourth spacer layer on a fourth sidewall of the third spacer layer.

2. The method of manufacturing the semiconductor structure of claim 1, wherein the first spacer layer comprises an insulating nitride.

3. The method of manufacturing the semiconductor structure of claim 1, wherein the second spacer layer comprises SiCO.

4. The method of manufacturing the semiconductor structure of claim 1, wherein the third spacer layer comprises an insulating oxide.

5. The method of manufacturing the semiconductor structure of claim 1, wherein the fourth spacer layer comprises an insulating nitride.

6. The method of manufacturing the semiconductor structure of claim 1, wherein performing the oxidation process on the second spacer layer is prior to forming the fourth spacer layer on the fourth sidewall of the third spacer layer.

7. The method of manufacturing the semiconductor structure of claim 1, wherein the oxidized portion of the second spacer layer comprises $SiO_2$, and the third spacer layer comprises $SiO_2$.

8. The method of manufacturing the semiconductor structure of claim 1, wherein the oxidation process is a plasma oxidation process.

9. The method of manufacturing the semiconductor structure of claim 8, wherein the plasma oxidation process comprises $O_2$ and $H_2N_2$ plasma oxidation process.

10. The method of manufacturing the semiconductor structure of claim 1, wherein the first spacer layer, the second spacer layer, and the third spacer layer have a first thickness, a second thickness, and a third thickness, respectively, the second thickness is greater than the third thickness, and the third thickness is greater than the first thickness.

11. A method of manufacturing a semiconductor structure, comprising:
   forming a bit line structure over a substrate;
   forming a first spacer layer on a first sidewall of the bit line structure, wherein the first spacer layer comprises an insulating nitride;
   forming a second spacer layer on a second sidewall of the first spacer layer, wherein the second spacer layer comprises SiCO and has a first portion and a second portion, and the first portion is between the first spacer layer and the second portion;
   forming a third spacer layer to cover the second portion of the second spacer layer;
   performing an oxidation process to oxidize the second portion of the second spacer layer;
   forming a fourth spacer layer on a third sidewall of the third spacer layer; and
   forming a buried contact adjacent to the fourth spacer layer.

12. The method of manufacturing the semiconductor structure of claim 11, wherein the oxidation process is a plasma oxidation process.

13. The method of manufacturing the semiconductor structure of claim 12, wherein the plasma oxidation process comprises $O_2$ and $H_2N_2$ plasma oxidation process.

14. The method of manufacturing the semiconductor structure of claim 12, wherein the third spacer layer has a first thickness before performing the oxidation process, the third spacer layer has a second thickness after performing the oxidation process, and the second thickness is less than the first thickness.

15. The method of manufacturing the semiconductor structure of claim 11, wherein the third spacer layer comprises an insulating oxide.

16. The method of manufacturing the semiconductor structure of claim 11, wherein the fourth spacer layer comprises an insulating nitride.

17. The method of manufacturing the semiconductor structure of claim 11, wherein performing the oxidation process to oxidize the second portion of the second spacer layer is prior to forming the fourth spacer layer on the third sidewall of the third spacer layer.

* * * * *